(12) United States Patent
Noritsune et al.

(10) Patent No.: US 7,436,677 B2
(45) Date of Patent: Oct. 14, 2008

(54) ELECTRONIC DEVICE

(75) Inventors: Hiroyuki Noritsune, Tokyo (JP); Hisanori Nobe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/341,624

(22) Filed: Jan. 30, 2006

(65) Prior Publication Data

US 2007/0127222 A1    Jun. 7, 2007

(30) Foreign Application Priority Data

Dec. 7, 2005    (JP)    ............................. 2005-353171

(51) Int. Cl.
*H05K 7/18* (2006.01)

(52) U.S. Cl. ...................... 361/752; 361/730; 361/728; 174/50.52; 174/520

(58) Field of Classification Search ................ 361/752, 361/728–730, 807; 174/52.1, 50.52–54, 174/50, 520, 50.54; 439/76.1, 76.2
See application file for complete search history.

(56) References Cited

U.S. PATENT DOCUMENTS

| | | | | |
|---|---|---|---|---|
| 4,047,242 A * | 9/1977 | Jakob et al. | ................ | 361/714 |
| 5,187,643 A * | 2/1993 | I-Shou | ................ | 361/685 |
| 5,280,410 A * | 1/1994 | Klinger et al. | ................ | 361/709 |
| 6,034,876 A * | 3/2000 | Ohno et al. | ................ | 361/752 |
| 6,042,392 A * | 3/2000 | Tsuji | ................ | 439/76.1 |
| 6,094,349 A * | 7/2000 | Fassel et al. | ................ | 361/704 |
| 6,275,385 B1 * | 8/2001 | Sahara et al. | ................ | 361/752 |
| 6,392,895 B2 * | 5/2002 | Taguchi et al. | ................ | 361/752 |
| 6,407,925 B1 * | 6/2002 | Kobayashi et al. | ................ | 361/752 |
| 6,431,884 B1 * | 8/2002 | Wallace et al. | ................ | 439/86 |
| 6,493,232 B2 * | 12/2002 | Skofljanec | ................ | 361/752 |
| 6,707,678 B2 * | 3/2004 | Kobayashi et al. | ................ | 361/752 |
| 6,717,051 B2 * | 4/2004 | Kobayashi et al. | ................ | 361/752 |
| 6,728,110 B2 * | 4/2004 | Koyama | ................ | 361/752 |
| 6,927,337 B2 * | 8/2005 | Kobayashi et al. | ................ | 174/535 |
| 7,190,589 B2 * | 3/2007 | Caines et al. | ................ | 361/707 |
| 7,227,757 B2 * | 6/2007 | Mizutani | ................ | 361/752 |

FOREIGN PATENT DOCUMENTS

| | | |
|---|---|---|
| JP | 50-012289 | 2/1975 |
| JP | 05-275868 A | 10/1993 |
| JP | 2964816 B2 | 8/1999 |
| JP | 11-243283 A | 9/1999 |
| JP | 2003-087461 A | 3/2003 |

* cited by examiner

*Primary Examiner*—Dean A. Reichard
*Assistant Examiner*—Dameon E. Levi
(74) *Attorney, Agent, or Firm*—Sughrue Mion, PLLC

(57) ABSTRACT

Provided is an electronic device which does not require difficult machining operation to reduce a wall thickness of a case by cutting, which helps to secure a satisfactory operational efficiency for the mounting of a connector to the case, and which allows the wall thickness of the case to be set at an appropriate level. An electronic device according to the present invention includes: a case which has a dish-shaped sectional configuration and an opening and which has a recess formed in a side wall by notching from an end surface of the opening; a connector fit-engaged with the recess; and an electronic circuit board provided in the case. In the electronic device, the case, which is formed by molding, diverges toward the opening, and the connector is fitted into the recess in an axial direction of the side wall to be mounted perpendicularly to the side wall.

6 Claims, 4 Drawing Sheets

ELECTRONIC DEVICE

BACKGROUND OF THE INVENTION

1. Field of the Invention

The present invention relates to an electronic device equipped with a case having a recess, a connector fit-engaged with the recess, and an electronic circuit board provided in the case.

2. Description of the Related Art

In a conventional electronic device, a connector is fit-engaged with a case having a dish-shaped sectional configuration and an opening and provided with a recess formed in a side wall by notching from an end surface of the opening (see, for example, JP 2964816 B (FIG. 1)).

When forming a dish-shaped case by molding, it is necessary for the convex mold to be equipped with slopes to facilitate its releasing. Thus, the inner surfaces of the side walls of the case are slopes diverging toward the opening.

Thus, when the side walls of the case are to be formed so as to be perpendicular to the bottom surface of the case, it is necessary, for example, to cut away the inner wall surfaces of the side walls to thereby reduce the wall thickness, with the cutting amount gradually increasing toward the bottom surface.

In the case thus formed and having side walls extending perpendicularly to the bottom surface, a connector is fitted into a recess in a side wall in the direction perpendicular to the bottom surface, and the connector is mounted so as to be perpendicular to the side wall.

In this case, the connector is mounted to the case by fitting the connector into the recess of the case in the direction perpendicular to the bottom surface of the case to thereby mount the connector to the case. When performing the fitting, the force applied to the connector is a perpendicular force, which contributes to the fitting as it is, thus providing a satisfactory operational efficiency for mounting the connector to the case. However, this construction has a problem in that it is necessary to perform difficult machining operation on the inner wall surfaces of the side walls to increasingly reduce the wall thickness toward the bottom surface.

Further, a reduction in wall thickness by cutting results in an uniform wall thickness of the case. In determining the wall thickness of the case, care must be taken so that the requisite physical strength is secured even in a portion where the wall thickness is small. Thus, while the requisite physical strength is secured, a portion with an excessive wall thickness is involved, which makes the production cost so much the higher.

SUMMARY OF THE INVENTION

The present invention has been made with a view toward solving the above problems. It is an object of the present invention to provide an electronic device which does not require difficult machining operation to reduce a wall thickness of a case by cutting, which helps to secure a satisfactory operational efficiency for the mounting of a connector to the case, and which allows the wall thickness of the case to be set at an appropriate level.

The electronic device according to the present invention includes: a case which has a dish-shaped sectional configuration and an opening and which has a recess formed in a side wall by notching from an end surface of the opening; a connector fit-engaged with the recess; and an electronic circuit board provided in the case. In the electronic device, the case, which is formed by molding, diverges toward the opening, and the connector is fitted into the recess in an axial direction of the side wall to be mounted perpendicularly to the side wall.

In the electronic device of the present invention, there is no need to perform the difficult machining operation to reduce the wall thickness of the case by cutting, and a satisfactory operational efficiency for the mounting of the connector to the case is secured. Further, it is possible to set the wall thickness of the case at an appropriate level.

DESCRIPTION OF THE PREFERRED EMBODIMENTS

Figure 1:
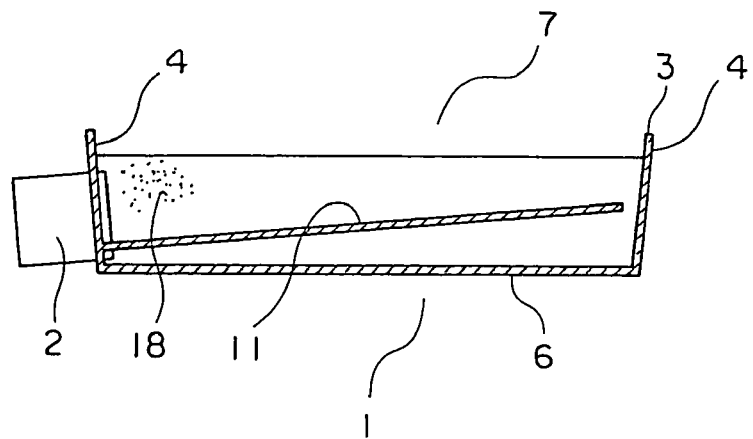
FIG. 1 is a structural view showing a relationship between a case, a connector, and an electronic circuit board in an electronic device according to Embodiment 1 of the present invention.

In the following, embodiments of the present invention will be described. The components and portions of one embodiment that are the same as or equivalent to those of another embodiment are indicated by the same reference numerals.

Embodiment 1

Figure 2:
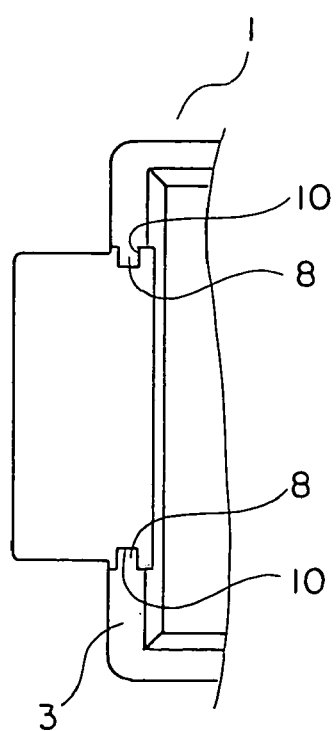
FIG. 2 is a partial plan view of FIG. 1.
Figure 3:
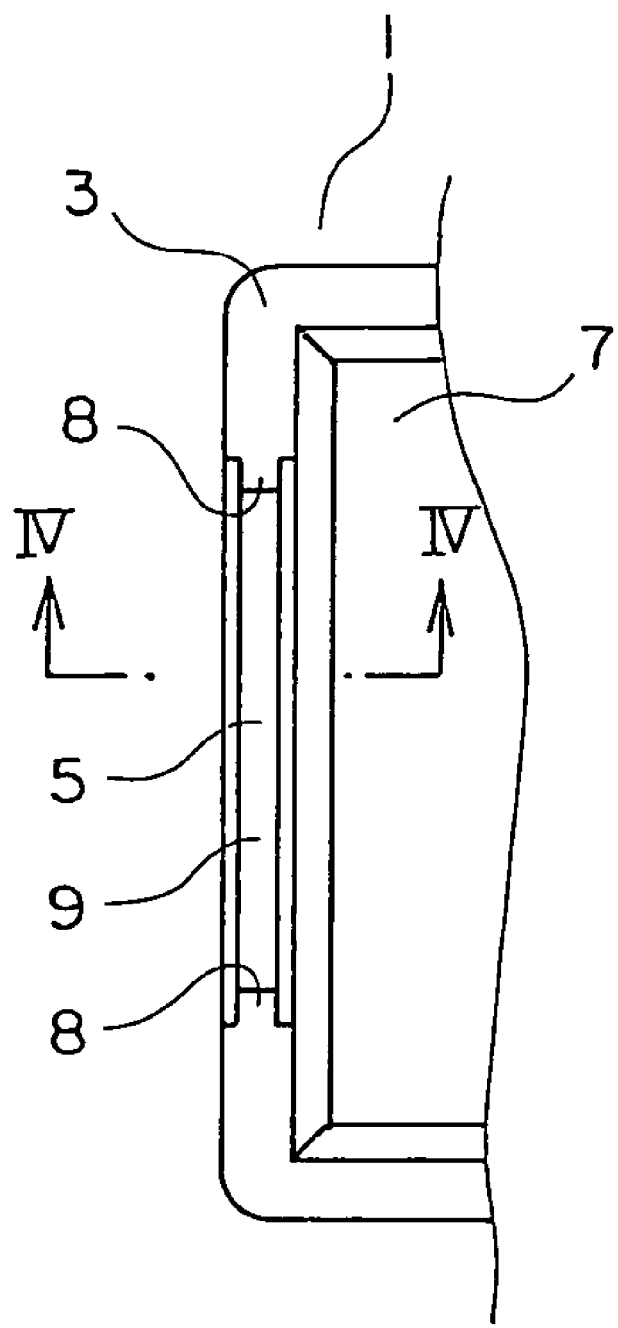
FIG. 3 is a partial plan view of the case of FIG. 1.
Figure 4:
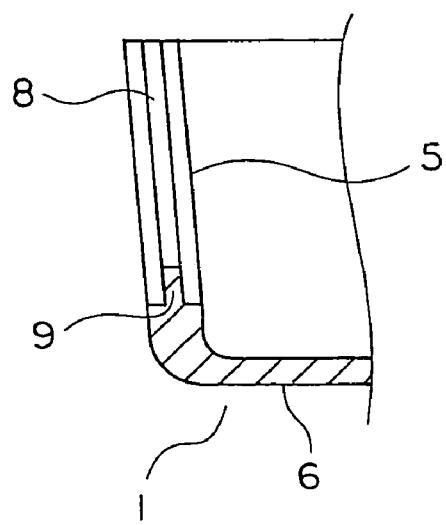
FIG. 4 is a sectional view taken along an arrow line IV-IV of FIG. 3.

FIG. 1 is a structural view showing a relationship between a case 1, a connector 2, and an electronic circuit board 11 in an electronic device according to Embodiment 1 of the present invention, FIG. 2 is a partial plan view of FIG. 1, FIG. 3 is a partial plan view of the case of FIG. 1, and FIG. 4 is a sectional view taken along an arrow line IV-IV of FIG. 3.

The case 1, which is made of metal, has a dish-shaped sectional configuration with an opening 7. The case 1 which has a uniform wall thickness is formed by molding, and diverges from a bottom surface 6 toward the opening 7.

One side wall 4 of the case 1 is provided with a recess 5 formed by notching from an end surface 3 of the opening 7. On both sides of the recess 5, there are formed side protrusions 8, which extend so as to be opposed and parallel to each other. At the bottom of the recess 5, there is formed a bottom protrusion 9 extending between a pair of side protrusions 8. The width dimension of the side protrusions 8 and the bottom protrusion 9 is fixed.

The connector 2 is fitted from above into the recess 5 of the side wall 4 in the axial direction to be mounted so as to be perpendicular to the side wall 4.

The connector 2 has groove portions 10 with a fixed groove width in both side surfaces and in the bottom surface thereof, and the side protrusions 8 and the bottom protrusion 9 of the case 1 are fitted into the groove portions 10.

Inside the case 1, there is provided the electronic circuit board 11 connected to the connector 2. The electronic circuit board 11 extends perpendicularly from the side wall 4.

Further, the interior of the case 1 is filled with resin 18.

In the electronic device of this embodiment, the connector 2 is fitted into the recess 5 in the axial direction of the side wall 4, and is mounted so as to be perpendicular to the side wall 4. The force applied to the connector 2 when the connector 2 is fitted into the recess 5 contributes as it is to the fitting, and the connector 2 is smoothly mounted to the case 1.

In existing connectors, the electronic circuit board is normally mounted so as to be perpendicular to the connector. In this embodiment also, the electronic circuit board 11 extends perpendicularly from the side wall 4, and is provided so as to be perpendicular to the connector 2, so that an existing connector with no special specifications may be used as the connector 2.

The case 1 is formed in a dish-shaped configuration by molding. To facilitate its releasing, the convex mold is equipped with slopes. In the case 1, the inner surfaces of the side walls 4 diverge from the bottom surface 6 toward the opening 7, so that the case 1 can be formed just by releasing the convex mold from the concave mold. Thus, the case 1 can be formed easily.

Figure 5:
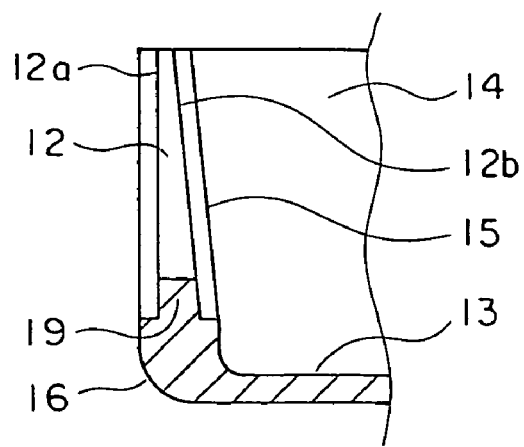
FIG. 5 is a partial sectional view of the case of a conventional electronic device.

As shown in FIG. 5, in a known case 16, outer side surfaces 12a of side protrusions 12 are perpendicular to a bottom surface 13, whereas inner side surface 12b, which are formed by a slope of the convex mold, are inclined with respect to the bottom surface. That is, the inner side surfaces 12b diverge toward the opening 14, with the width dimension of the side protrusions 12 being gradually diminished toward the opening 14.

In this case, when the connector 2 is fitted into a recess 15 of the case 16, gaps are generated between the recess 15 and the groove portions 10 of the connector 2 with a fixed groove width, in particular, on the opening 14 side of the case 16 since the width dimension of the side protrusions 12 is not fixed, resulting in a deterioration in the sealing property between the case 16 and the connector 2. To prevent this, it is necessary to apply a relatively large amount of sealing adhesive to the gaps.

In this embodiment, in contrast, the width dimension of the side protrusions 8 diverging toward the opening 7 is fixed, so that the side protrusions 8 and the groove portions 10 of the connector 2 are in intimate contact with each other, so the requisite sealing property is secured between the case 1 and the connector 2, and it is possible to reduce the amount of adhesive used.

Embodiment 2

Figure 6:
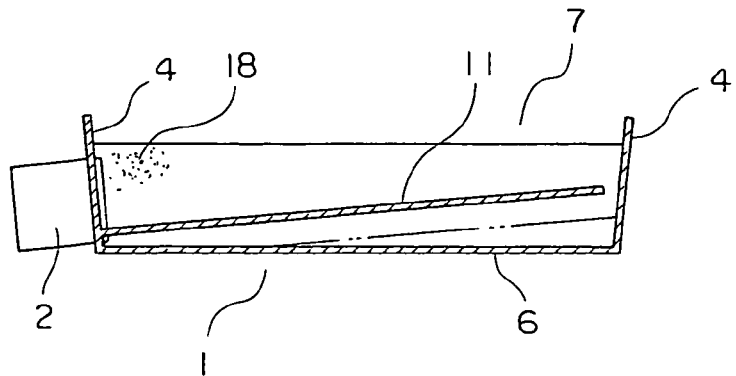
FIG. 6 is an explanatory view related to an electronic device according to Embodiment 2 of the present invention.

In Embodiment 1, the electronic circuit board 11 is inclined with respect to the bottom surface 6 of the case 1. Thus, a region between a chain double-dashed line of FIG. 6 and the bottom surface 6 may constitute an unnecessary region.

Figure 7:
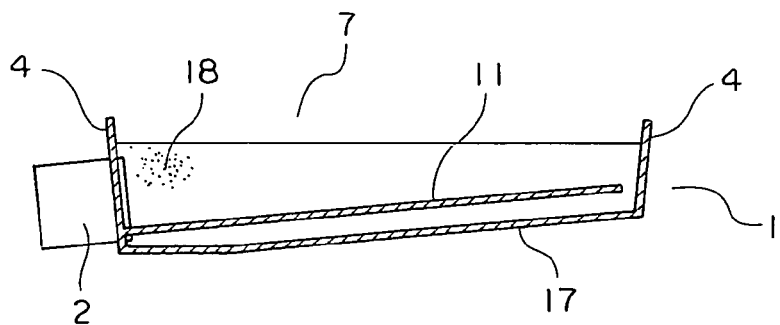
FIG. 7 is a structural view showing a relationship between a case, a connector, and an electronic circuit board in an electronic device according to Embodiment 2 of the present invention.

FIG. 7 shows an example in which, to eliminate this unnecessary region, there is formed at the bottom surface 6 a planar portion 17 that is parallel to the electronic circuit board 11.

Figure 8:
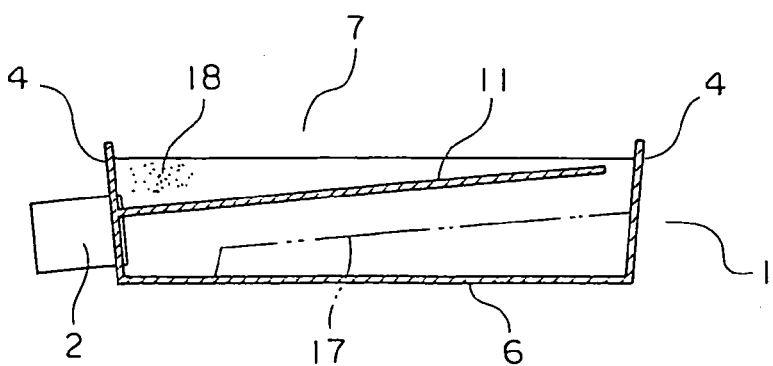
FIG. 8 is a structural view showing another example of the relationship between the case, the connector, and the electronic circuit board in an electronic device according to Embodiment 2 of the present invention.

FIG. 8 shows an example in which the electronic circuit board 11 is mounted to the upper portion of the connector 2 so as to be perpendicular to the connector 2. In this example also, a region between a chain double-dashed line of FIG. 8 and the bottom surface 6 may constitute an unnecessary region. In this case also, like in the case 1 of FIG. 7, there is formed at the bottom surface 6 a planar portion that is parallel to the electronic circuit board 11 to thereby eliminate this unnecessary region.

By thus forming the case 1 with the unnecessary region eliminated, it is possible to reduce the weight and volume of the case 1.

Otherwise, this embodiment is of the same construction as Embodiment 1.

While in Embodiments 1 and 2 described above, the side protrusions 8 with a fixed width dimension extending toward the opening 7 are formed on the opposing side surfaces of the recess 5, and the groove portions 10 with a fixed groove width, into which the side protrusions 8 are to be fitted, are formed in the connector 2, it is also possible to form groove portions with a fixed groove width extending toward the opening 7 in the opposing side surfaces of the recess 5, and to form, in the connector 2, protrusions with a fixed width dimension, which are to be fitted into the groove portions.

Further, while in Embodiments 1 and 2 as described above the case 1 is formed of metal, the present invention is naturally also applicable to a case in which the case is formed of resin.

What is claimed is:

1. An electronic device comprising:
   a case which has a dish-shaped sectional configuration including side walls and an opening, and which has a recess formed in one of the side walls by notching from an end surface of the opening;
   a connector fit-engaged with the recess; and
   an electronic circuit board provided in the case,
   wherein: the case is formed by molding; the side walls diverge from a bottom surface of the case toward the opening; and the connector is fitted into the recess in an axial direction of the side wall to be mounted perpendicularly to the side wall; and the electronic circuit board is provided so that the electric circuit board is perpendicular to the connector and is inclined towards at least a part of the bottom surface of the case.

2. An electronic device according to claim 1, wherein: side protrusions with a fixed width dimension each extending toward the opening are formed on opposing side surfaces of the recess; and groove portions with a fixed groove width to be fit-engaged with the side protrusions are formed in the connector.

3. An electronic device according to claim 1, wherein: groove portions with a fixed width dimension each extending toward the opening are formed on opposing side surfaces of the recess; and side protrusions to be fit-engaged with the groove portions are formed in the connector.

4. An electronic device according to claim 1, wherein a planar portion parallel to the electronic circuit board is formed at a bottom surface of the case.

5. An electronic device according to claim 1, wherein the case is formed of metal.

6. An electronic device according to claim 2, wherein: a bottom surface of said recess is formed with one of a protrusion and a groove, and said connector is formed with one of a groove and protrusion to be fit engaged with said one of a protrusion and groove of said bottom surface.

* * * * *